United States Patent
Zhang et al.

(10) Patent No.: US 12,006,011 B2
(45) Date of Patent: Jun. 11, 2024

(54) PYRAM-SHAPED DEEP-SEA PRESSURE-RESISTANT SHELL AND DESIGN METHOD THEREOF

(71) Applicant: JIANGSU UNIVERSITY OF SCIENCE AND TECHNOLOGY, Jiangsu (CN)

(72) Inventors: Jian Zhang, Jiangsu (CN); Xiaobin Liu, Jiangsu (CN); Chenyang Di, Jiangsu (CN); Ming Zhan, Jiangsu (CN); Yongsheng Li, Jiangsu (CN); Tan Zhao, Jiangsu (CN); Fang Wang, Jiangsu (CN); Wenxian Tang, Jiangsu (CN)

(73) Assignee: JIANGSU UNIVERSITY OF SCIENCE AND TECHNOLOGY, Jiangsu (CN)

( * ) Notice: Subject to any disclaimer, the term of this patent is extended or adjusted under 35 U.S.C. 154(b) by 0 days.

(21) Appl. No.: 18/276,451

(22) PCT Filed: Mar. 18, 2022

(86) PCT No.: PCT/CN2022/081712
§ 371 (c)(1),
(2) Date: Aug. 9, 2023

(87) PCT Pub. No.: WO2023/087586
PCT Pub. Date: May 25, 2023

(65) Prior Publication Data
US 2024/0116612 A1 Apr. 11, 2024

(30) Foreign Application Priority Data
Nov. 16, 2021 (CN) .......................... 202111384175.3

(51) Int. Cl.
*B63G 8/04* (2006.01)
*G06F 30/17* (2020.01)
*B63B 3/13* (2006.01)

(52) U.S. Cl.
CPC ............... *B63G 8/04* (2013.01); *G06F 30/17* (2020.01); *B63B 3/13* (2013.01)

(58) Field of Classification Search
CPC .............. B63G 8/04; B63B 3/13; G06F 30/17
(Continued)

(56) References Cited

U.S. PATENT DOCUMENTS 5,477,798 A * 12/1995 Ness .......................... B63B 3/13
114/65 R
9,599,224 B2 3/2017 Asakawa et al.

FOREIGN PATENT DOCUMENTS

CN 104648638 5/2015
CN 104986312 10/2015
(Continued)

OTHER PUBLICATIONS

"International Search Report (Form PCT/ISA/210) of PCT/CN2022/081712", mailed on Aug. 5, 2022, with English translation thereof, pp. 1-6.

*Primary Examiner* — Anthony D Wiest
(74) *Attorney, Agent, or Firm* — JCIPRNET (57) ABSTRACT

A pyram-shaped deep-sea pressure-resistance shell and a design method therefor. The shell comprises a conical shell, an annular combined shell, a cylindrical shell, a flange bolt, and a perforated thick plate; a bottom end of the conical shell is connected with a top end of the annular combined shell, the conical shell being in communication with an interior part of the annular combined shell; the perforated thick plate blocks the bottom end of the annular combined shell, the perforated thick plate and the annular combined shell being connected by means of multiple flange bolts; the cylindrical
(Continued)

shell is disposed inside the annular combined shell, a lower end of the cylindrical shell being inserted in a gap between the annular combined shell and the perforated thick plate.

8 Claims, 3 Drawing Sheets

(58) Field of Classification Search
USPC .................................................. 114/312, 339
See application file for complete search history.

(56) References Cited

FOREIGN PATENT DOCUMENTS

| | | | |
|---|---|---|---|
| CN | 108909935 | | 11/2018 |
| CN | 112141260 | A * | 12/2020 |
| CN | 112182738 | | 1/2021 |
| CN | 112307659 | | 2/2021 |
| CN | 114013560 | | 2/2022 |
| EP | 2306050 | | 4/2011 |

* cited by examiner

PYRAM-SHAPED DEEP-SEA PRESSURE-RESISTANT SHELL AND DESIGN METHOD THEREOF

CROSS-REFERENCE TO RELATED APPLICATION

This application is a 371 of international application of PCT application serial no. PCT/CN2022/081712, filed on Mar. 18, 2022, which claims the priority benefit of China application no. 202111384175.3, filed on Nov. 16, 2021. The entirety of each of the above mentioned patent applications is hereby incorporated by reference herein and made a part of this specification.

TECHNICAL FIELD

The present disclosure relates to a pressure-resistant shell, and especially to a pyram-shaped deep-sea pressure-resistant shell and a design method thereof.

BACKGROUND

The pressure-resistant shell is a thin shell structure that is subjected to a hydrostatic pressure, which requires good mechanical properties, space utilization in the shell, fluid dynamics characteristics and occupant comfort, and the performances of the submersible such as safety, carrying capacity, maneuverability and diving time need to be improved.

Spherical, cylindrical or annular shell structures are mainly adopted by the pressure-resistant shell of submersibles in services. Among them, the spherical structure shell has strong pressure resistance, but its internal space utilization is low. Although the cylindrical structure shell has the advantage of high space utilization rate, its mechanical properties are poor, and the internal stiffener needs to be increased, which sacrifices a certain space inside the shell. The annular shell structure has strong pressure resistance, but its space is not easy to expand, resulting in low space utilization. It can be seen that these properties cannot be effectively coordinated by the existing pressure-resistant shells, which are technical problems in the development of submersibles.

Many shell structures with good pressure resistance characteristics have been created in nature, among them, the pyram is a long-term underwater living organism, and the shell has the advantages such as good weight strength ratio, streamline and aesthetic characteristics, and the structure has enough strength and stability without strengthening the support, which is an excellent pressure resistant structure. However, how to implement bionic application is an extremely difficult problem.

SUMMARY

The objectives of the present disclosure are that: in view of the above problems, the objectives of the present disclosure are to provide a pyram-shaped deep-sea pressure-resistant shell with good mechanical characteristics, space utilization rate inside the shell, occupant comfort, safety and carrying capacity, as well as a design method thereof Technical solutions are as follows. The pyram-shaped deep-sea pressure-resistant shell comprises a conical shell, an annular combined shell, a cylindrical shell, a flange bolt and a perforated thick plate; a bottom end of the conical shell is connected with a top end of the annular combined shell, the conical shell is in communication with an interior part of the annular combined shell; the perforated thick plate blocks the bottom end of the annular combined shell, the perforated thick plate and the annular combined shell are connected by means of multiple flange bolts; the cylindrical shell is disposed inside the annular combined shell, a lower end of the cylindrical shell is inserted in a gap between the annular combined shell and the perforated thick plate, and an upper end and the lower end of the cylindrical shell are respectively connected to an inner peripheral surface of the annular combined shell.

Further, the annular combined shell includes a first annular shell, a second annular shell and a third annular shell connected from an upper end to a lower end in sequence, and the first annular shell, the second annular shell and the third annular shell are internally connected, an upper end of the first annular shell is connected to the conical shell, a bottom end of the third annular shell is connected to the perforated thick plate, the cylindrical shell is arranged inside the third annular shell.

Further, an outside peripheral surface of the cylindrical shell is provided with at least two channels, such that the first annular shell, the second annular shell and the third annular shell are interconnected with each other.

Further, outer shell surfaces of the first annular shell, the second annular shell and the third annular shell are all circular arc surfaces, with outer diameters of the first annular shell, the second annular shell and the third annular shell increasing in sequence, and centers of circular cross-sections of the circular arc surfaces of the first annular shell, the second annular shell and the third annular shell are all located on an extension line of an outer profile of the conical shell.

Optimally, the conical shell, the first annular shell, the second annular shell and the third annular shell are sequentially welded and fixed into a whole.

Further, the flange bolt includes a bolt, a first flange, a sealing ring, a second flange, a washer, and a nut. The first flange is fixed to a bottom surface of the annular combined shell, the second flange is fixed to a bottom surface of the perforated thick plate, the bolt is threaded and arranged in the first flange and the second flange in sequence, such that the first flange and the second flange are in securely threaded-connection with each other through the nut, the sealing ring is arranged between a connection surface of the first flange and the second flange, and the washer is arranged between a contact surface of the nut and the second flange.

Provided is a method of designing the pyram-shaped deep-sea pressure-resistant shell. The method comprises the following steps.

Step 1:

Given that a height of an isosceles triangle inside the pyram-shaped deep-sea pressure-resistant shell is H, then:

$$H=(L+2r_2+2r_3+2r_4)\cos \alpha;$$

where L represents a length of a generatrix of the conical shell, $r_2$ represents a circumference radius of the first annular shell, $r_3$ represents a circumference radius of the second annular shell, $r_4$ represents a circumference radius of the second annular shell, and α represents a half-cone angle; and rotation radii of the conical shell, the first annular shell, the second annular shell, the third annular shell and the cylindrical shell are obtained through the design values for circular radii of the shells by calculation.

Step 2:

Given that a thickness of the conical shell is $t_1$:

$$t_1 = \text{Max}\{t_{1e}, t_{1b}\};$$

where $$t_{1e} = \frac{\sqrt{3}\,pR_1}{8[\sigma]\cos\alpha}; \text{ and}$$

$$t_{1b} = \frac{0.75pK_1(R_1+r)}{[\sigma]\cos^2\alpha};$$

where p represents a calculated pressure, [σ] represents an allowable stress, α represents the half-cone angle, $R_1$ represents a radius of a large end of the conical shell, r represents a radius of a small end of the conical shell, and $K_1$ represents a parameter related to reinforcing ribs;

a meridional thin film stress $\sigma_\varphi$, a circumferential thin film stress $\sigma_\theta$ and an equivalent stress $\sigma_e$ of the conical shell are respectively according to a theory of thin shell:

$$\sigma_\varphi = -\frac{pR}{8t}\cdot\frac{1}{\cos\alpha};$$

$$\sigma_\theta = -\frac{pR}{4t}\cdot\frac{1}{\cos\alpha}; \text{ and}$$

$$\sigma_e = \sqrt{\sigma_\varphi^2 + \sigma_\theta^2 - \sigma_\varphi\sigma_\theta};$$

the meridional thin film stress $\sigma_\varphi$ and the circumferential thin film stress $\sigma_\theta$ are substituted into the equivalent stress $\sigma_e$ to determined a thickness of a conical shell with equal thickness $t_{1e}$ based on a criterion of a maximum equivalent stress $[\sigma_e]_{max}$ being less than or equal to the allowable stress [σ] of materials, in consideration of the maximum equivalent stress $[\sigma_e]_{max}$ being equal to the allowable stress [σ] of the materials during design;

according to a calculation formula of a buckling load for the conical shell:

$$p = \frac{2[\sigma]\cdot\cos^2\alpha\cdot t}{1.5K_1(R+r)};$$

a thickness of the conical shell with equal thickness $t_{1b}$ is determined by calculation;

the thickness of the shell derived from a principle of thin films and the formula of the buckling load above is calculated respectively, and a maximum thickness of the two is determined as an ultimate thickness of the conical shell.

Step 3:

Given that a thickness of annular shells of the first annular shell, the second annular shell and the third annular shell $t_i$ is:

$$t_i = \text{Max}\{t_{ie}, t_{ib}\} \ (i=2,3,4);$$

where $$t_{ie} = \frac{pr_i\sqrt{1+\frac{R_i}{R_i+r_i\sin\alpha}+\left(\frac{R_i}{R_i+r_i\sin\alpha}\right)^2}}{2[\sigma]}; \text{ and}$$

$$t_{ib} = \left[\frac{p\cdot\left(\frac{R_i^2}{r_i^5}\right)^{\frac{1}{3}}}{0.1738E\cdot(1-\mu^2)^{\frac{2}{3}}}\right]^{\frac{3}{7}};$$

where i takes 2, 3, 4, p represents the calculated pressure, [σ] represents the allowable stress, $R_i$ represents a rotating pitch diameter of the annular shell, $r_i$ represents a circumference radius of the annular shell, α represents the half-cone angle, E represents an elastic modulus, μ represents Poisson's ratio;

the maximum meridional thin film stress $\sigma_\varphi$, the maximum circumferential thin film stress $\sigma_\theta$ and the maximum equivalent stress $\sigma_e$ of the annular shell are respectively according to the theory of thin shell:

$$\sigma_\varphi = -\frac{pr}{2t}\cdot\frac{2R+r\sin\alpha}{R+r\sin\alpha};$$

$$\sigma_\theta = -\frac{pr}{2t}; \text{ and}$$

$$\sigma_e = \sqrt{\sigma_\varphi^2 + \sigma_\theta^2 - \sigma_\varphi\sigma_\theta};$$

the maximum meridional thin film stress $\sigma_\varphi$ and the maximum circumferential thin film stress $\sigma_\theta$ are substituted into the maximum equivalent stress $\sigma_e$ to determine a thickness of an annular shell with equal thickness $t_{ie}$, based on a criterion of the maximum equivalent stress $[\sigma_e]_{max}$ being less than or equal to the allowable stress [σ] of materials, in consideration of the maximum equivalent stress $[\sigma_e]_{max}$ being equal to the allowable stress [σ] of the materials during design;

According to Jordan Formula, a critical buckling load for the annular shell is expressed as:

$$p = 0.1738E\left[\frac{\left(\frac{t}{r}\right)^7(1-\mu^2)^2}{\left(\frac{R}{r}\right)^2}\right]^{\frac{1}{3}};$$

a thickness of the annular shell with equal thickness $t_{ib}$ is determined by calculation according to the above formula;

The thickness of the shell derived from the principle of thin film and the formula of the load above is respectively calculated, and a maximum thickness of the two is determined as an ultimate thickness of the first annular shell, the second annular shell and the third annular shell.

Step 4:

Given that a thickness of the cylindrical shell $t_5$ is:

$$t_5 = \text{Max}\{t_{5e}, t_{5b}\};$$

where $$t_{5e} = \frac{\sqrt{3}\,pR}{2[\sigma]}; \text{ and}$$

$$t_{5b} = \left(\frac{plR^{\frac{3}{2}}}{0.92E}\right)^{\frac{2}{5}};$$

where p represents the calculated pressure, [σ] represents the allowable stress, R represents a rotating radius of the cylindrical shell, l represents a height of the cylindrical shell and E represents the elastic modulus;

a meridional thin film stress $\sigma_\varphi$, a circumferential thin film stress $\sigma_\theta$ and an equivalent stress $\sigma_e$ of the cylindrical shell are respectively according to the theory of thin shell:

$$\sigma_\varphi = -\frac{pR}{2t};$$

$$\sigma_\theta = -\frac{pR}{t}; \text{ and}$$

$$\sigma_e = \sqrt{\sigma_\varphi^2 + \sigma_\theta^2 - \sigma_\varphi \sigma_\theta};$$

the meridional thin film stress $\sigma_\varphi$ and the circumferential thin film stress $\sigma_\theta$ are substituted into the equivalent stress $\sigma_e$ to determine a thickness of a cylindrical shell with equal thickness $t_{5e}$, based on a criterion of the maximum equivalent stress $[\sigma_e]_{max}$ being less than or equal to the allowable stress $[\sigma]$ of materials, in consideration of the maximum equivalent stress $[\sigma_e]_{max}$ being equal to the allowable stress $[\sigma]$ of the materials during design;

a calculation formula of a buckling load for the cylindrical shell is:

$$p = 0.92 \frac{Et}{l} \left(\frac{t}{r}\right)^{\frac{3}{2}};$$

a thickness of the cylindrical shell with equal thickness $t_{5b}$ is determined by calculation; and the thickness of the shell derived from the principle of thin films and the formula of the load above is respectively calculated, and a maximum thickness of the two is determined as an ultimate thickness of the cylindrical shell.

Optimally, in Step 1, it is taken that $K_1=1$.

Beneficial effects are that: compared with the prior art, the advantages of the present disclosure are as follows.

1. In the present disclosure, the thickness of the shell is calculated by two methods including the strength and stability of the shell, and the mechanical characteristics of the pressure-resistant shell are comprehensively considered, thereby being conducive to improving the strength and stability of the pressure-resistant shell, and the use of equal thickness structure is capable of reducing the difficulty and cost of processing and manufacturing.

2. The present disclosure adopts a pyram-shaped structure formed by stacking the conical shell, the annular shell and the cylindrical shell, thereby eliminating the problem that the space of the traditional annular shell is difficult to be expanded, such that the pressure-resistant shell has good mechanical characteristics, space utilization rate inside the shell and occupant comfort. The cylindrical shell separation is provided inside the shell, and three hatch positions are provided, thus being conducive to improving the safety, carrying capacity and personnel mobility of the submersible.

DETAILED DESCRIPTION OF THE EMBODIMENTS

The present disclosure is further elucidated below in conjunction with the drawings and specific embodiments, it should be understood that these embodiments are merely intended to illustrate the present disclosure and not to limit the scope of the present disclosure.

Figure 1:
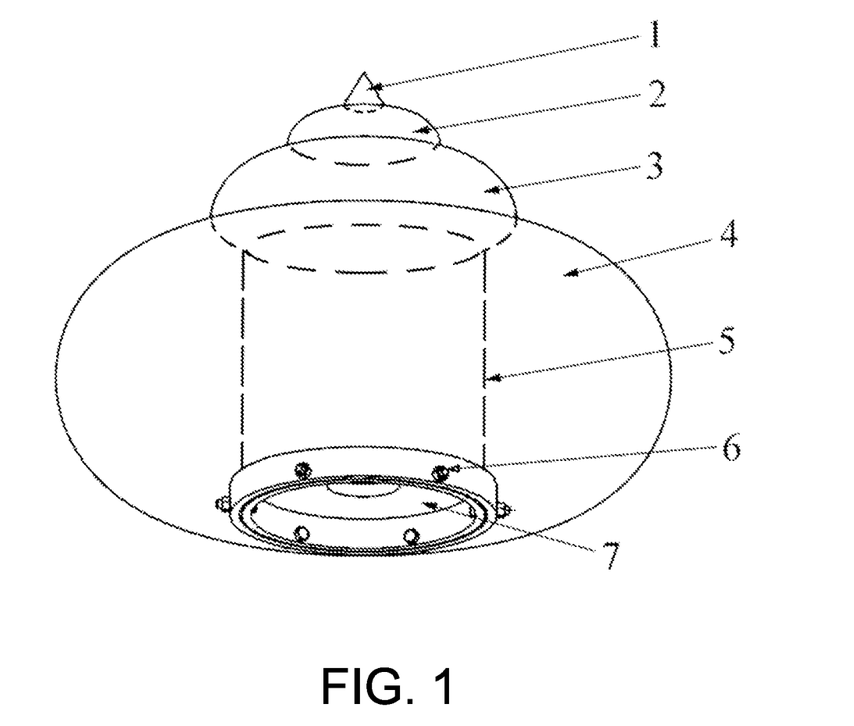
FIG. 1 illustrates a three-dimensional structural schematic diagram of the present disclosure.
Figure 2:
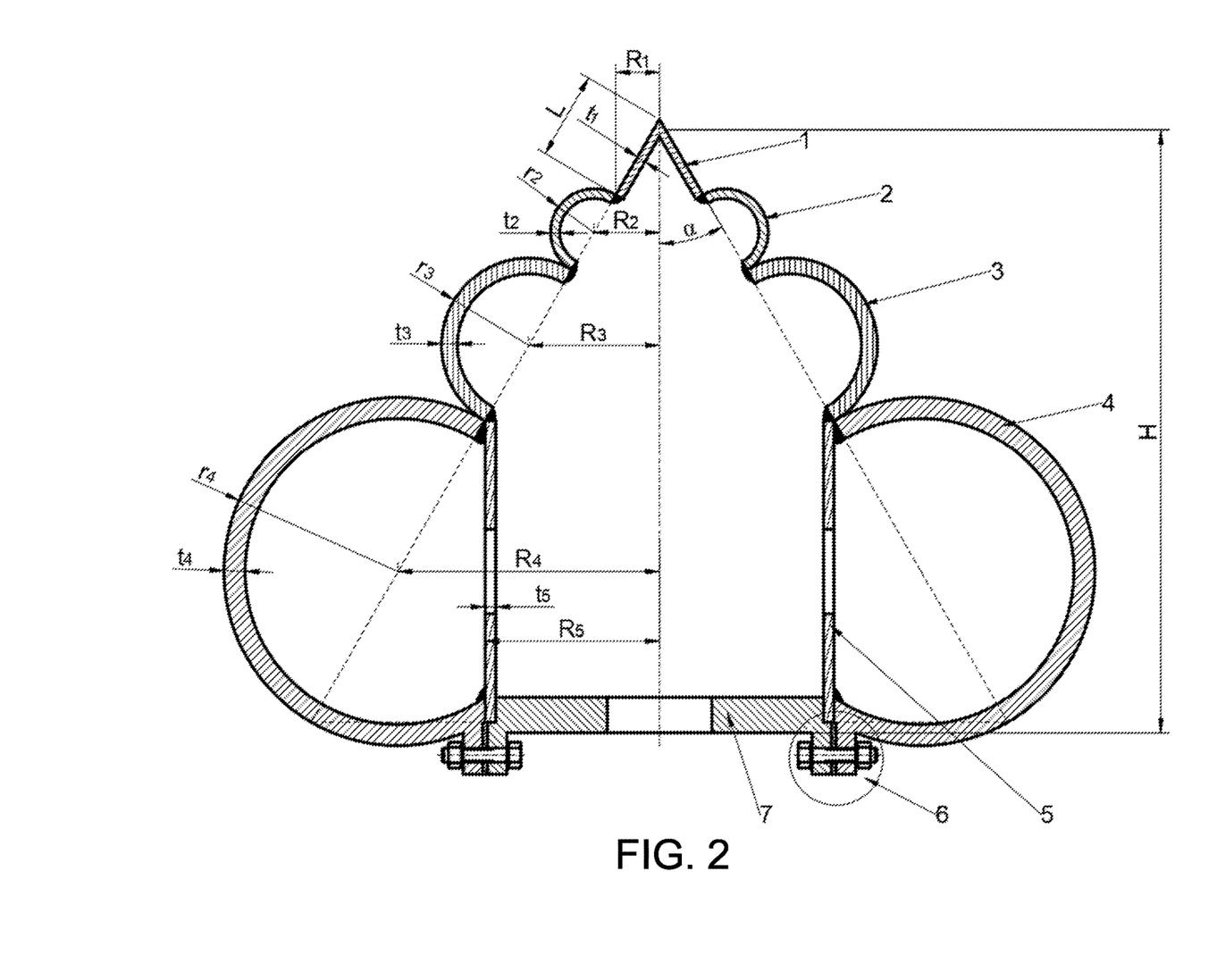
FIG. 2 illustrates a section structural schematic diagram of the present disclosure.
Figure 3:
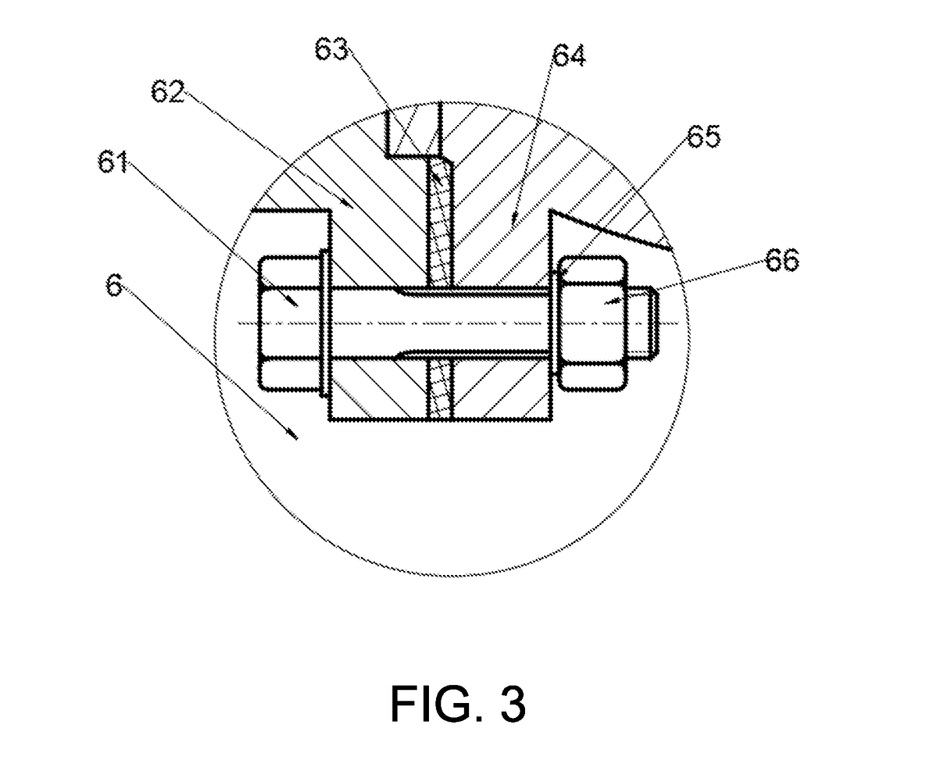
FIG. 3 illustrates a partial enlargement structural schematic diagram of the threaded-connection by means of flange bolt in FIG. 2 of the present disclosure.

The pyram-shaped deep-sea pressure-resistant shell, as illustrated in FIGS. 1 to 3, comprises a conical shell 1, an annular combined shell, a cylindrical shell 5, a flange bolt 6 and a perforated thick plate 7; the annular combined shells includes a first annular shell 2, a second annular shell 3 and a third annular shell 4 connected from an upper end to a lower end; and the conical shell 1 in sequence, the conical shell 1, the first annular shell 2, the second annular shell 3, the third annular shell 4 and the cylindrical shell 5 are shells with equal thickness.

The upper end of the first annular shell 2 is connected to the conical shell 1 and the two are interconnected with each other. The perforated thick plate 7 blocks the bottom end of the third annular shell 4 and the two are connected with each other by a plurality of flange bolts 6. The flange bolt 6 includes a bolt 61, a first flange 62, a sealing ring 63, a second flange 64, a washer 65 and a nut 66. The first flange 62 is fixed to a bottom surface of the annular combined shell, the second flange 64 is fixed to a bottom surface of the perforated thick plate 7, the bolt 61 is threaded and arranged in the first flange 62 and the second flange 64 in sequence, such that the first flange 62 and the second flange 64 are in securely threaded-connection with each other through the nut 66, the sealing ring 63 is arranged between a connection surface of the first flange 62 and the second flange 64, and the washer 65 is arranged between a contact surface of the nut 66 and the second flange 64.

The cylindrical shell 5 is disposed inside the third annular shell 4 and the lower end of the cylindrical shell 5 is inserted in a gap between the annular combined shell and the perforated thick plate 7, and an upper end and the lower end of the cylindrical shell 5 are respectively connected to an inner peripheral surface of the annular combined shell. The outer peripheral surface of the cylindrical shell 5 is provided with at least two channels, so that the first annular shell 2, the second annular shell 3 and the third annular shell 4 are interconnected with each other.

Outer shell surfaces of the first annular shell 2, the second annular shell 3 and the third annular shell 4 are all circular arc surfaces, with outer diameters of the first annular shell 2, the second annular shell 3 and the third annular shell 4 increasing in sequence. The centers of the circular cross-sections of the circular arc surfaces of the first annular shell 2, the second annular shell 3 and the third annular shell 4 are all located on an extension line of the outer profile of the conical shell 1. The conical shell 1, the first annular shell 2, the second annular shell 3 and the third annular shell 4 are sequentially welded and fixed into a whole.

The above method of designing the pyram-shaped deep-sea pressure-resistant shell, comprises the following steps.

Step 1:

The height of the isosceles triangle inside the pyram-shaped deep-sea pressure-resistant shell is as shown in Formula (1), $$H=(L+2r_2+2r_3+2r_4)\cos \alpha; \quad (1)$$

where L represents a length of a generatrix for the conical shell, $r_2$ represents a circumference radius of the first annular shell, $r_3$ represents a circumference radius of the second annular shell, $r_4$ represents a circumference radius of the second annular shell, and $\alpha$ represents a half-cone angle, and rotation radii of the conical shell, the first annular shell, the second annular shell, the third annular shell and the cylindrical shell are obtained through the design values for circular radii of the shells by calculation.

Step 2:

Given that a thickness of the conical shell in the pyram-shaped deep-sea pressure-resistant shell is $t_1$:

$$t_1 = \text{Max}\{t_{1e}, t_{1b}\}; \tag{2}$$

where $$t_{1e} = \frac{\sqrt{3}\, pR_1}{8[\sigma]\cos\alpha}; \tag{3}$$

$$t_{1b} = \frac{0.75 pK_1(R_1+r)}{[\sigma]\cos^2\alpha}; \tag{4}$$

where p represents a calculated pressure, $[\sigma]$ represents an allowable stress, $\alpha$ represents the half-cone angle, $R_1$ represents a radius of a large end of the conical shell, r represents a radius of a small end of the conical shell, and $K_1$ represents a parameter related to reinforcing ribs, and it is taken that $K_1=1$, the derivation processes of Formulas (3) and (4) are as follows:

according to a theory of thin shell, a meridional thin film stress $\sigma_\varphi$, a circumferential thin film stress $\sigma_\theta$ and an equivalent stress $\sigma_e$ of the conical shell are as shown by Formulas (5) to (7):

$$\sigma_\varphi = -\frac{pR}{8t}\cdot\frac{1}{\cos\alpha}; \tag{5}$$

$$\sigma_\theta = -\frac{pR}{4t}\cdot\frac{1}{\cos\alpha}; \tag{6}$$

$$\sigma_e = \sqrt{\sigma_\varphi^2 + \sigma_\theta^2 - \sigma_\varphi\sigma_\theta}; \tag{7}$$

the formula (5) and the formula (6) are substituted into the formula (7) to obtain the equivalent stress of the shell; a thickness of a conical shell with equal thickness $t_{ie}$ in Formula (3) is determined, based on a criterion of a maximum equivalent stress $[\sigma_e]_{max}$ is less than or equal to the allowable stress $[\sigma]$ of materials, in consideration of the maximum equivalent stress $[\sigma_e]_{max}$ being equal to the allowable stress $[\sigma]$ of the materials during design.

The calculation formula of a buckling load for the conical shell is:

$$p = \frac{2[\sigma]\cdot\cos^2\alpha\cdot t}{1.5K_1(R+r)}; \tag{8}$$

the thickness of the conical shell with equal thickness $t_{1b}$ in Formula (4) is determined by calculation through the above Formula (8), and the thickness of the shell derived from the principle of thin films and the formula of the buckling load above is respectively calculated, and a maximum thickness of the two is determined as an ultimate thickness of the conical shell.

Step 3:

The thickness of annular shells of the pyram-shaped deep-sea pressure-resistant shell $t_i$ is:

$$t_i = \text{Max}\{t_{ie}, t_{ib}\} \ (i=2,3,4); \tag{9}$$

where $$t_{ie} = \frac{pr_i\sqrt{1 + \frac{R_i}{R_i+r_i\sin\alpha} + \left(\frac{R_i}{R_i+r_i\sin\alpha}\right)^2}}{2[\sigma]}; \tag{10}$$

$$t_{ib} = \left[\frac{p\cdot\left(\frac{R_i^2}{r_i^5}\right)^{\frac{1}{3}}}{0.1738E\cdot(1-\mu^2)^{\frac{2}{3}}}\right]^{\frac{3}{7}}; \tag{11}$$

where i takes 2, 3, 4, p represents the calculated pressure, $[\sigma]$ represents the allowable stress, $R_i$ represents a rotating pitch diameter of the annular shell, $r_i$ represents a circumference radius of the annular shell, $\alpha$ represents the half-cone angle, E represents an elastic modulus, $\mu$ represents Poisson's ratio, the derivation processes of Formulas (10) and (11) are as follows:

according to the theory of thin shells, the maximum meridional thin film stress $\sigma_\varphi$, the maximum circumferential thin film stress $\sigma_\theta$ and the maximum equivalent stress $\sigma_e$ of the annular shell are as shown by Formulas (12) to (14):

$$\sigma_\varphi = -\frac{pr}{2t}\cdot\frac{2R+r\sin\alpha}{R+r\sin\alpha}; \tag{12}$$

$$\sigma_\theta = -\frac{pr}{2t};\text{ and} \tag{13}$$

$$\sigma_e = \sqrt{\sigma_\varphi^2 + \sigma_\theta^2 - \sigma_\varphi\sigma_\theta}, \tag{14}$$

the formula (12) and the formula (13) are substituted into the formula (14) to obtain the maximum equivalent stress of the shell; a thickness of an annular shell with equal thickness $t_{ie}$ in Formula (10) is determined based on a criterion of the maximum equivalent stress $[\sigma]$ being less than or equal to the allowable stress $[\sigma]$ of materials, in consideration of the maximum equivalent stress $[\sigma_e]_{max}$ being equal to the allowable stress $[\sigma]$ of the materials during design.

according to Jordan Formula, a critical buckling load for the annular shell is expressed as:

$$p = 0.1738E\left[\frac{\left(\frac{t}{r}\right)^7(1-\mu^2)^2}{\left(\frac{R}{r}\right)^2}\right]^{\frac{1}{3}}; \tag{15}$$

according to the above formula (15), a thickness of the annular shell with equal thickness $t_{ib}$ in (11) is determined by calculation, the thickness of the shell derived from the principle of thin film and the load formula above are respectively calculated, and a maximum thickness from two of them is determined as an ultimate thickness of the annular shell.

Step 4:

When a thickness of the cylindrical shell $t_5$ in the pyram-shaped deep-sea pressure-resistant shell is:

$$t_5 = \text{Max}\{t_{5e}, t_{5b}\}; \tag{16}$$

where $$t_{5e} = \frac{\sqrt{3}\,pR}{2[\sigma]};\quad(17)$$

$$t_{5b} = \left(\frac{plR^{\frac{3}{2}}}{0.92E}\right)^{\frac{2}{5}};\quad(18)$$

where p represents the calculated pressure, $[\sigma]$ represents the allowable stress, R represents a rotating radius of the cylindrical shell, l represents a height of the cylindrical shell and E represents the elastic modulus, the derivation processes of Formulas (17) and (18) are as follows:

according to the theory of thin shells, a meridional thin film stress $\sigma_\varphi$, a circumferential thin film stress $\sigma_\theta$ and an equivalent stress $\sigma_e$ of the cylindrical shell are as shown by Formulas (19) to (21):

$$\sigma_\varphi = -\frac{pR}{2t};\quad(19)$$

$$\sigma_\theta = -\frac{pR}{t};\quad(20)$$

$$\sigma_e = \sqrt{\sigma_\varphi^2 + \sigma_\theta^2 - \sigma_\varphi \sigma_\theta};\quad(21)$$

Formula (19) and Formula (20) are substituted into Formula (21) to obtain the equivalent stress of the shell; a thickness of a cylindrical shell with equal thickness $t_{5e}$ in Formula (17) is determined, based on a criterion of the maximum equivalent stress $[\sigma_e]_{max}$ being less than or equal to the allowable stress $[\sigma]$ of materials, in consideration of the maximum equivalent stress $[\sigma_e]_{max}$ being equal to the allowable stress $[\sigma]$ of the materials during design, the calculation formula of a buckling load for the cylindrical shell is:

$$p = 0.92\frac{Et}{l}\left(\frac{t}{r}\right)^{\frac{3}{2}};\quad(22)$$

the thickness of the cylindrical shell with equal thickness $t_{5b}$ in Formula (18) is determined by calculation through the above formula (22), the thickness of the shell derived from the principle of thin films and the formula of the load above is respectively calculated, and a maximum thickness of the two is determined as an ultimate thickness of the cylindrical shell, A calculation example of the above design method is as follows.

The pyram-shaped deep-sea pressure-resistant shell and the perforated thick plate under the shell are made of high strength steel 0Cr17Ni4Cu4Nb, the allowable stress $[\sigma]$ is 865 MPa, the elastic modulus of the materials is 213 GPa, the Poisson's ratio is 0.27, the density is 7.78 g/cm³, according to the above formulas, the structure design of the pyram-shaped deep-sea pressure-resistant shell under water depth 2 Km is carried out.

(1) Height Design

The half-cone angle of the conical shell a is designed to be 30°, and the proportion of each segment on the waist of the isosceles triangle on the pressure-resistant shell is $L:2r_2:2r_3:2r_4=1:1:2:4$, the length of L is designed to be 1 m, then $r_2$ is 0.5 m, $r_3$ is 1 m, $r_4$ is 2 m, the rotation radii of the conical shell, the first annular shell, the second annular shell, the third annular shell and the cylindrical shell are obtained by calculation, so that $R_1$ is 0.5 m, $R_2$ is 0.75 m, $R_3$ is 1.5 m, $R_4$ is 3 m, $R_5$ is 2 m.

The height H of is the whole pyram-shaped deep-sea pressure-resistant shell is obtained by calculating according to Formula (1):

$$H=(L+2r_2+2r_3+2r_4)\cos\alpha$$
$$=(1+2\times0.5+2\times1+2\times2)\times\cos 30°=6.928\text{ m}.$$

(2) Thickness Design

The calculated pressure p which is 32.67 MPa under water depth 2 Km is obtained according to Formula (16):

$$p=K\rho_0 gh/0.9;\quad(16)$$

where K represents a safety factor, which is taken to be 1.5; $\rho_0$ represents the density of sea water, which is taken to be take 1000 kg/m³; g represents the acceleration of gravity, which is taken to be 9.8 m/s²; h represents the water depth, which is taken to be 2 Km.

The thickness of the conical shell:
the thickness of the conical shell is obtained by calculation according to Formula (3):

$$t_{1e} = \frac{\sqrt{3}\,pR_1}{8[\sigma]\cos\alpha} = \frac{\sqrt{3}\times 32.67\times 0.5}{8\times 865\times\cos 30°} = 0.005\text{ m}$$

the thickness of the conical shell is obtained by calculation according to Formula (4):

$$t_{1b} = \frac{0.75pK_1(R_1+r_1)}{[\sigma]\cos^2\alpha} = \frac{0.75\times 32.67\times 1\times(0.5+0)}{865\times\cos^2(30°)} = 0.019\text{ m}$$

the thickness of the conical shell $t_1$ is obtained according to Formula (2):

$$t_1=\text{Max}\{t_{1e},t_{1b}\}=\text{Max}\{0.005,0.019\}=0.019\text{ m}.$$

The thickness of the first annular shell:
the thickness of the first annular shell is obtained by calculation according to Formula (10):

$$t_{2e} = \frac{pr_2\sqrt{1+\frac{R_2}{R_2+r_2\sin\alpha}+\left(\frac{R_2}{R_2+r_2\sin\alpha}\right)^2}}{2[\sigma]} =$$

$$\frac{32.67\times 0.5\times\sqrt{1+\frac{0.75}{0.75+0.5\times\sin 30°}+\left(\frac{0.75}{0.75+0.5\times\sin 30°}\right)^2}}{2\times 865} =$$

0.014 m the thickness of the first annular shell is obtained by calculation according to Formula (11):

$$t_{2b} = \left[\frac{p\cdot\left(\frac{R_2^2}{r_2^5}\right)^{\frac{1}{3}}}{0.1738E\cdot(1-\mu^2)^{\frac{2}{3}}}\right]^{\frac{3}{7}} = \left[\frac{32.67\times\left(\frac{0.75^2}{0.5^5}\right)^{\frac{1}{3}}}{0.1738\times 213\times 10^3\times(1-0.27^2)^{\frac{2}{3}}}\right]^{\frac{3}{7}} = 0.076\text{ m}$$

the thickness of the first annular shell $t_2$ is obtained according to Formula (9):

$$t_2 = \text{Max}\{t_{2e}, t_{2b}\} = \text{Max}\{0.014, 0.076\} = 0.076 \text{ m}.$$

The thickness of the second annular shell:
the thickness of the second annular shell is obtained by calculation according to Formula (10):

$$t_{3e} = \frac{pr_3\sqrt{1+\dfrac{R_3}{R_3+r_3\sin\alpha}+\left(\dfrac{R_3}{R_3+r_3\sin\alpha}\right)^2}}{2[\sigma]} =$$

$$\frac{32.67\times 1 \times \sqrt{1+\dfrac{1.5}{1.5+1\times\sin 30°}+\left(\dfrac{1.5}{1.5+1\times\sin 30°}\right)^2}}{2\times 865} = 0.043 \text{ m}$$

the thickness of the second annular shell is obtained by calculation according to Formula (11):

$$t_{3b} = \left[\frac{p\cdot\left(\dfrac{R_3^2}{r_3^5}\right)^{\frac{1}{3}}}{0.1738E\cdot(1-\mu^2)^{\frac{2}{3}}}\right]^{\frac{3}{7}} = \left[\frac{32.67\times\left(\dfrac{1.5^2}{1^5}\right)^{\frac{1}{3}}}{0.1738\times 213\times 10^3\times(1-0.27^2)^{\frac{2}{3}}}\right]^{\frac{3}{7}} = 0.056 \text{ m}$$

the thickness of the second annular shell $t_3$ is obtained according to Formula (9):

$$t_2 = \text{Max}\{t_{2e}, t_{2b}\} = \text{Max}\{0.043, 0.056\} = 0.056 \text{ m}.$$

The thickness of the third annular shell:
the thickness of the third annular shell is obtained by calculation according to the formula (10):

$$t_{4e} = \frac{pr_4\sqrt{1+\dfrac{R_4}{R_4+r_4\sin\alpha}+\left(\dfrac{R_4}{R_4+r_4\sin\alpha}\right)^2}}{2[\sigma]} =$$

$$\frac{32.67\times 2\times\sqrt{1+\dfrac{3}{3+2\times\sin 30°}+\left(\dfrac{3}{3+2\times\sin 30°}\right)^2}}{2\times 865} = 0.057 \text{ m}$$

the thickness of the third annular shell is obtained by calculation according to Formula (11):

$$t_{4b} = \left[\frac{p\cdot\left(\dfrac{R_4^2}{r_4^5}\right)^{\frac{1}{3}}}{0.1738E\cdot(1-\mu^2)^{\frac{2}{3}}}\right]^{\frac{3}{7}} = \left[\frac{32.67\times\left(\dfrac{3^2}{2^5}\right)^{\frac{1}{3}}}{0.1738\times 213\times 10^3\times(1-0.27^2)^{\frac{2}{3}}}\right]^{\frac{3}{7}} = 0.042 \text{ m}$$

the thickness of the third annular shell $t_4$ is obtained according to Formula (9):

$$t_2 = \text{Max}\{t_{2e}, t_{2b}\} = \text{Max}\{0.057, 0.042\} = 0.057 \text{ m}.$$

The thickness of the cylindrical shell:
the height of the cylindrical shell is design to be the height of the intermediate part of the third annular shell, and the height l is taken to be 3.4 m.

the thickness of the cylindrical shell is obtained by calculating according to Formula (17):

$$t_{5e} = \frac{\sqrt{3}\,pR_5}{2[\sigma]} = \frac{\sqrt{3}\times 32.67\times 2}{2\times 865} = 0.065 \text{ m}$$

the thickness of the cylindrical shell is obtained by calculating according to Formula (18):

$$t_{5b} = \left(\frac{plR_5^{\frac{3}{2}}}{0.92E}\right)^{\frac{2}{5}} = \left(\frac{32.67\times 3.4\times 2^{\frac{3}{2}}}{0.92\times 213\times 10^3}\right)^{\frac{2}{5}} = 0.076 \text{ m}$$

the thickness of the cylindrical shell $t_5$ is obtained according to Formula (16):

$$t_5 = \text{Max}\{t_{5e}, t_{5b}\} = \text{Max}\{0.065, 0.076\} = 0.076 \text{ m}.$$

The specific design parameters of the pressure-resistant shell in this embodiment are as shown in Table 1.

TABLE 1

| design parameters for the pyram-shaped deep-sea pressure-resistant shell under water depth 2 Km. | |
|---|---|
| H | 6.928 m |
| α | 30° |
| L | 1 m |
| $R_1$ | 0.5 m |
| $t_{1e}$ | 0.005 m |
| $t_{1b}$ | 0.019 m |
| $t_1$ | 0.019 m |
| $r_2$ | 0.5 m |
| $R_2$ | 0.75 m |
| $t_{2e}$ | 0.014 m |
| $t_{2b}$ | 0.076 m |
| $t_2$ | 0.076 m |
| $r_3$ | 1 m |
| $R_3$ | 1.5 m |
| $t_{3e}$ | 0.043 m |
| $t_{3b}$ | 0.056 m |
| $t_3$ | 0.056 m |
| $r_4$ | 2 m |
| $R_4$ | 3 m |
| $t_{4e}$ | 0.057 m |
| $t_{4b}$ | 0.042 m |
| $t_4$ | 0.057 m |
| $R_5$ | 2 m |
| l | 3.4 m |
| $t_{5e}$ | 0.065 m |
| $t_{5b}$ | 0.076 m |
| $t_5$ | 0.076 m |

What is claimed is:

1. A pyram-shaped deep-sea pressure-resistant shell, comprising a conical shell, an annular combined shell, a cylindrical shell, a flange bolt, and a perforated thick plate; wherein a bottom end of the conical shell is connected with a top end of the annular combined shell, an interior part of the conical shell is in communication with an interior part of the annular combined shell; the perforated thick plate blocks a bottom end of the annular combined shell, the perforated thick plate and the annular combined shell are connected by means of multiple flange bolts; the cylindrical shell is disposed inside the annular combined shell, a lower end of the cylindrical shell is inserted in a gap between the annular combined shell and the perforated thick plate, and an upper end of the cylindrical shell and the lower end of the cylindrical shell are respectively connected to an inner peripheral surface of the annular combined shell.

2. The pyram-shaped deep-sea pressure-resistant shell according to claim 1, wherein the annular combined shell includes a first annular shell, a second annular shell and a third annular shell connected from an upper end of the annular combined shell to a lower end of the annular combined shell in sequence, and the first annular shell, the second annular shell and the third annular shell are internally connected, an upper end of the first annular shell is connected to the conical shell, a bottom end of the third annular shell is connected to the perforated thick plate, the cylindrical shell is arranged inside the third annular shell.

3. The pyram-shaped deep-sea pressure-resistant shell according to claim 2, wherein an outside peripheral surface of the cylindrical shell is provided with at least two channels, such that the first annular shell, the second annular shell and the third annular shell are interconnected with each other.

4. The pyram-shaped deep-sea pressure-resistant shell according to claim 2, wherein outer shell surfaces of the first annular shell, the second annular shell and the third annular shell are all circular arc surfaces, with outer diameters of the first annular shell, the second annular shell and the third annular shell increasing in sequence, and centers of circular cross-sections of the circular arc surfaces of the first annular shell, the second annular shell and the third annular shell are all located on an extension line of an outer profile of the conical shell.

5. The pyram-shaped deep-sea pressure-resistant shell according to claim 2, wherein the conical shell, the first annular shell, the second annular shell and the third annular shell are sequentially welded and fixed into a whole.

6. The pyram-shaped deep-sea pressure-resistant shell according to claim 1, wherein the flange bolt includes a bolt, a first flange, a sealing ring, a second flange, a washer and a nut, the first flange is fixed to a bottom surface of the annular combined shell, the second flange is fixed to a bottom surface of the perforated thick plate, the bolt is threaded and arranged in the first flange and the second flange in sequence, such that the first flange and the second flange are in securely threaded-connection with each other through the nut, the sealing ring is arranged between a connection surface of the first flange and the second flange, and the washer is arranged between a contact surface of the nut and the second flange.

7. A method of designing the pyram-shaped deep-sea pressure- resistant shell according to claim 2 comprising following steps:

Step 1, given that a height of an isosceles triangle inside the pyram-shaped deep-sea pressure-resistant shell is H, then:

$$H=(L+2r_2+2r_3+2r_4)\cos\alpha;$$

where L represents a length of a generatrix of the conical shell, $r_2$ represents a circumference radius of the first annular shell, $r_3$ represents a circumference radius of the second annular shell, $r_4$ represents a circumference radius of the second annular shell, and $\alpha$ represents a half-cone angle;

obtaining, through design values for circular radii of the shells, rotation radii of the conical shell, the first annular shell, the second annular shell, the third annular shell and the cylindrical shell by calculation;

Step 2, given that a thickness of the conical shell is $t_1$: $t_1 = \text{Max}\{t_{1e}, t_{1b}\}$;

wherein $$t_{1e} = \frac{\sqrt{3}\,pR_1}{8[\sigma]\cos\alpha}; \text{ and}$$

$$t_{1b} = \frac{0.75pK_1(R_1+r)}{[\sigma]\cos^2\alpha};$$

where p represents a calculated pressure, [σ] represents an allowable stress, α represents the half-cone angle, $R_1$ represents a radius of a large end of the conical shell, r represents a radius of a small end of the conical shell, and $K_1$ represents a parameter related to reinforcing ribs;

a meridional thin film stress $\sigma_\varphi$, a circumferential thin film stress $\sigma_\theta$ and an equivalent stress $\sigma_e$ of the conical shell being respectively according to a theory of thin shells:

$$\sigma_\varphi = -\frac{pR}{8t} \cdot \frac{1}{\cos\alpha};$$

$$\sigma_\theta = -\frac{pR}{4t} \cdot \frac{1}{\cos\alpha}; \text{ and}$$

$$\sigma_e = \sqrt{\sigma_\varphi^2 + \sigma_\theta^2 - \sigma_\varphi\sigma_\theta};$$

substituting the meridional thin film stress $\sigma_\varphi$ and the circumferential thin film stress $\sigma_\theta$ into the equivalent stress $\sigma_e$, to obtain an equivalent stress of the shell, and determining, based on a criterion of a maximum equivalent stress $[\sigma_e]_{max}$ being less than or equal to the allowable stress $[\sigma]$ of materials, a thickness of a conical shell with equal thickness $t_{1e}$, in consideration of the maximum equivalent stress $[\sigma_e]_{max}$ being equal to the allowable stress $[\sigma]$ of the materials during design;

determining, according to a calculation formula of a buckling load for the conical shell, that is, $$p = \frac{2[\sigma] \cdot \cos^2\alpha \cdot t}{1.5K_1(R+r)},$$

a thickness of the conical shell with equal thickness $t_{1b}$ by calculation;

respectively calculating the thickness of the conical shell derived from a principle of thin films and the formula of the buckling load above, and determining a maximum thickness of the two as an ultimate thickness of the conical shell;

Step 3, given that a thickness of annular shells of the first annular shell, the second annular shell and the third annular shell $t_i$ is: $t_i = \text{Max}\{t_{ie}, t_{ib}\}$ (i=2,3,4);

wherein $$t_{ie} = \frac{pr_i\sqrt{1 + \frac{R_i}{R_i + r_i\sin\alpha} + \left(\frac{R_i}{R_i + r_i\sin\alpha}\right)^2}}{2[\sigma]}; \text{ and}$$

$$t_{ib} = \left[\frac{p \cdot \left(\frac{R_i^2}{r_i^5}\right)^{\frac{1}{3}}}{0.1738E \cdot (1-\mu^2)^{\frac{2}{3}}}\right]^{\frac{3}{7}};$$

where i takes 2, 3, 4, p represents the calculated pressure, [σ] represents the allowable stress, $R_i$ represents a rotating pitch diameter of the annular shell, $r_i$ represents a circumference radius of the annular shell, a represents the half-cone angle, E represents an elastic modulus, μ represents a Poisson's ratio;

a maximum meridional thin film stress $\sigma_\varphi$, a maximum circumferential thin film stress $\sigma_\theta$ and a maximum equivalent stress $\sigma_e$ of the annular shell are respectively according to the theory of thin shells:

$$\sigma_\varphi = -\frac{pr}{2t} \cdot \frac{2R + r\sin\alpha}{R + r\sin\alpha};$$

$$\sigma_\theta = -\frac{pr}{2t}; \text{ and}$$

$$\sigma_e = \sqrt{\sigma_\varphi^2 + \sigma_\theta^2 - \sigma_\varphi\sigma_\theta};$$

substituting the maximum meridional thin film stress $\sigma_\varphi$, and the maximum circumferential thin film stress $\sigma_\theta$ into the maximum equivalent stress $\sigma_e$, and determining, based on a criterion of the maximum equivalent stress $[\sigma_e]_{max}$ being less than or equal to the allowable stress [σ] of materials, a thickness of an annular shell with equal thickness $t_{ie}$, in consideration of the maximum equivalent stress $[\sigma_e]_{max}$ being equal to the allowable stress [σ] of the materials during design;

expressing, according to Jordan Formula, a critical buckling load for the annular shell as:

$$p = 0.1738E \left[\frac{\left(\frac{t}{r}\right)^7 (1-\mu^2)^2}{\left(\frac{R}{r}\right)^2}\right]^{\frac{1}{3}};$$

determining, according to the above formula, a thickness of the annular shell with equal thickness $t_{ib}$ by calculation;

respectively calculating the thickness of the annular shell derived from the principle of thin film and the formula of the load above, and determining a maximum thickness of the two as an ultimate thickness of the first annular shell, the second annular shell and the third annular shell; and Step 4, given that a thickness of the cylindrical shell $t_5$ is:
$t_5 = \text{Max}\{t_{5e}, t_{5b}\};$ wherein $$t_{5e} = \frac{\sqrt{3}\,pR}{2[\sigma]}; \text{ and}$$

$$t_{5b} = \left(\frac{plR^{\frac{3}{2}}}{0.92E}\right)^{\frac{2}{5}};$$

where p represents the calculated pressure, [σ] represents the allowable stress, R represents a rotating radius of the cylindrical shell, l represents a height of the cylindrical shell and E represents the elastic modulus;

a meridional thin film stress $\sigma_\varphi$, a circumferential thin film stress $\sigma_\theta$ and an equivalent stress $\sigma_e$ of the cylindrical shell are respectively according to the theory of thin shells:

$$\sigma_\varphi = -\frac{pR}{2t};$$

$$\sigma_\theta = -\frac{pR}{t}; \text{ and}$$

$$\sigma_e = \sqrt{\sigma_\varphi^2 + \sigma_\theta^2 - \sigma_\varphi\sigma_\theta};$$

substituting the meridional thin film stress $\sigma_{100}$ and the circumferential thin film stress $\sigma_\theta$ into the equivalent stress $\sigma_e$, and determining, based on a criterion of the maximum equivalent stress $[\sigma_e]_{max}$ being less than or equal to the allowable stress [σ] of materials, a thickness of a cylindrical shell with equal thickness $t_{5e}$, in consideration of the maximum equivalent stress $[\sigma_e]_{max}$ being equal to the allowable stress [σ] of the materials during design;

a calculation formula of a buckling load for the cylindrical shell being:

$$p = 0.92\frac{Et}{l}\left(\frac{t}{r}\right)^{\frac{3}{2}};$$

determining, according to the above formula, a thickness of the cylindrical shell with equal thickness $t_{5b}$; and respectively calculating the thickness of the cylindrical shell derived from the principle of thin films and the formula of the load above, and determining a maximum thickness of the two as an ultimate thickness of the cylindrical shell.

8. The method of designing the pyram-shaped deep-sea pressure-resistant shell according to claim 7, wherein in Step 2, $K_1=1$.

* * * * *